United States Patent
Worley (10) Patent No.: US 6,376,851 B1
(45) Date of Patent: Apr. 23, 2002

(54) OPTO-COUPLER APPLICATIONS SUITABLE FOR LOW EFFICIENCY SILICON BASED LEDS

(76) Inventor: Eugene Robert Worley, 11 Bowditch, Irvine, CA (US) 92620

( * ) Notice: Subject to any disclaimer, the term of this patent is extended or adjusted under 35 U.S.C. 154(b) by 0 days.

(21) Appl. No.: 09/400,252

(22) Filed: Sep. 21, 1999

Related U.S. Application Data
(60) Provisional application No. 60/101,442, filed on Sep. 21, 1998.

(51) Int. Cl.[7] .............................................. G02B 27/00
(52) U.S. Cl. ................... 250/551; 250/227.24
(58) Field of Search ................ 250/551, 239, 250/227.24; 438/24, 25, 26, 27, 28; 257/80, 81, 82, 83, 84, 85, 88, 93, 98

(56) References Cited

U.S. PATENT DOCUMENTS

| | | | | |
|---|---|---|---|---|
| 3,914,137 A | * | 10/1975 | Huffman et al. | 438/24 |
| 4,058,821 A | * | 11/1977 | Miyoshi et al. | 257/82 |
| 4,122,479 A | * | 10/1978 | Suqawara et al. | 257/82 |
| 4,857,746 A | * | 8/1989 | Kuhlmann et al. | 250/551 |
| 4,980,568 A | * | 12/1990 | Merrick et al. | 250/551 |
| 5,049,527 A | * | 9/1991 | Merrick et al. | 438/25 |
| 5,654,559 A | * | 8/1997 | Spaeth et al. | 257/82 |

\* cited by examiner

Primary Examiner—John R. Lee (57) ABSTRACT

Isolation circuits are shown which can be implemented using low efficiency LEDs such as those that can be made directly on silicon. Using silicon based LEDs results in reduced cost and facilitates the incorporation of many optically isolated channels using silicon chips separated with a transparent insulator. These circuits include a linear isolation device for analog signals, an isolated A to D converter, an isolated D to A converter, isolated buffer/driver circuits, isolated multiplexers, and isolated switches. Also, a microprocessor is shown with optically isolated I/O ports, A to D and D to A converters, a multiplexer, and solid state switches.

23 Claims, 5 Drawing Sheets

OPTO-COUPLER APPLICATIONS SUITABLE FOR LOW EFFICIENCY SILICON BASED LEDS

CROSS-REFERENCE TO RELATED APPLICATION

This application claims the benefit of United States Provisional Application No. 60/101,442, filed Sep. 21, 1998.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention.

This invention relates to applications of optically coupled electronic integrated circuits, and more particularly to applications in which two physically and electrically isolated silicon integrated circuits may each contain either a single LED or a plurality of LEDs and also either a single corresponding light detector or a plurality of corresponding light detectors. The LEDs are integrated onto the silicon substrate and may be fabricated by any number of means such as porous silicon, avalanching silicon PN junction, forward biased silicon PN junction, deposited silicon carbide junction, light emitting polymer, or deposited GaAs. Furthermore, these applications can be realized using low efficiency, silicon based LEDs

2. Prior Art.

Traditional opto-couplers are made using an GaAs LED and a silicon detector. In the simplest opto-couplers the detector is a single device such as a diode, a bipolar transistor, an SCR, or a Triac. Detector chips may also include circuits such as amplifiers and various types of output buffer/drivers. Moreover, an additional silicon chip can be added as a input buffer/driver for the LED. The input signal may be, for example, a TTL type which can not directly drive the LED. Since the LED diver chip must be isolated from the detector chip, three separate chips are thus required in this case: the silicon LED driver, the LED, and the detector chips.

Linear opto couplers have also been made which can transmit a voltage or a current level to an output from an isolated input.

The simple LED-detector opto-couplers require a reasonably efficient LED since the light must activate the detector which is also a switch without powered amplification. For example, the detector/switch may be a floating base bipolar transistor or a floating gate SCR. Light from the LED must provide enough photo generated base current to turn the bipolar transistor "On". In another application involving a simple switch a MOSFET is turned "On" by applying to the gate a photo voltage generated by a series of diodes illuminated by the LED. Unfortunately, these applications are not well suited for low efficiency, "on" silicon chip LEDs.

Some opto-coupler applications can make use of LEDs with much less efficiency if powered amplification is available for the detector output. Thus, low efficiency on silicon chip LEDs can find useful applications if the lower speed and increased amplification can be tolerated. There can be inherent cost savings in using on silicon chip LEDs if opto-coupler applications require circuits both on the LED side as well as on the detector side since only 2 and not 3 chips are needed. The biggest cost savings are applications which require multiple optical channels between two silicon chips. In these applications putting several discrete GaAs LEDs as well as at least two silicon chips in a package is not as cost effective as putting just two silicon chips in a package with on silicon LEDs.

Some potential applications for the on silicon LED include isolated linear amplifiers, isolated line drivers such as an RS232 driver, microprocessors with isolated I/Os, and isolated switches and switch arrays. Because of the low quantum efficiency of on chip silicon LEDs, to date none of these applications have been realized by industry in spite of the physical ability to do so.

SUMMARY OF THE INSTANT INVENTION

It is the objective of this invention to show how low efficiency, on chip silicon LEDs can be used to realize various types of optically isolated circuits. Specifically, these circuits include a linear isolation device for analog signals, an isolated A to D converter, an isolated D to A converter, isolated buffer/driver circuits, isolated multiplexers, and isolated switches. Also, a microprocessor is proposed with optically isolated I/O ports, A to D and D to A converters, a multiplexer, and solid state switches. These functions can be achieved using two silicon chips which optically communicate data back and forth. Isolation is achieved by placing a transparent, insulating barrier between the two chips through which light is transmitted.

PRIOR ART STATEMENT U.S. Pat. No. 5,049, 527.

DESCRIPTION OF THE PREFERRED EMBODIMENT

Figure 1A:
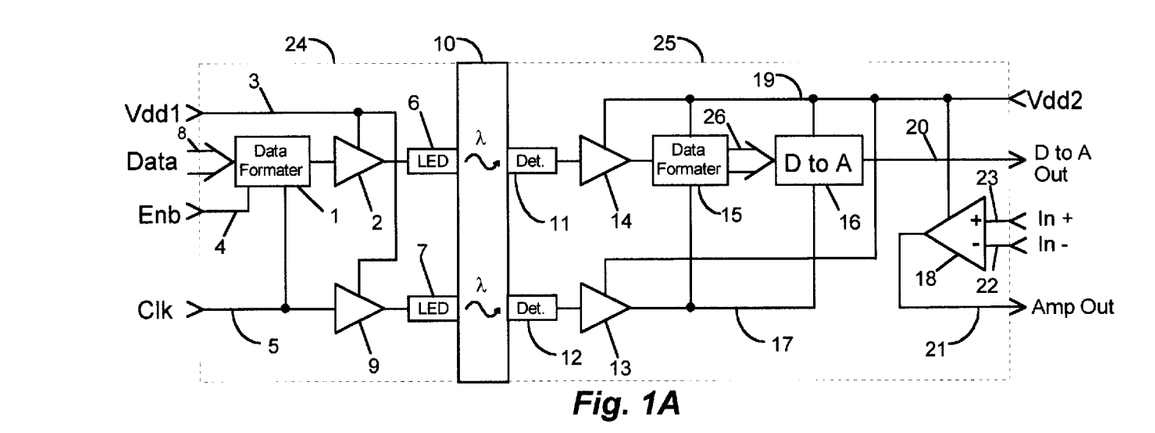
FIG. 1A shows a schematic diagram of a optically isolated D to A converter.

FIG. 1A shows an example of an optically isolated D to A converter which an be realized using low efficiency on chip silicon LEDs. It should be noted that the circuitry to the left of the transparent insulating barrier 10 exists on a first silicon chip 24 or integrated circuit and the circuitry to right of the barrier 10 exists on a second silicon chip 25. The first silicon chip 24 contains two integrated, on chip LEDs 6 and 7 while the second chip 25 contains two integrated light detectors 11 and 12.

A digital data word 8 is input to the first chip 24 which takes the data word 8 and puts it into a serial format via data formatter 1 using the clock 5 to time the operation. The enable input 4 is used to signal when a new data word is available for transmission. The serial data output from I is fed into a buffer 2 which is used to drive the on chip silicon LED 6. The clock signal 5 is also input to a buffer 9 which is used to drive a second on chip silicon LED 7.

A transparent insulating barrier 10 is used to electrically isolate chips 24 and 25 while allowing light to be transmitted. Light detector 11 receives the light emitted by LED 6 and outputs a signal corresponding to the serial data to amplifier 14. Amplifier 14 converts the weak signal from detector 11 into an appropriate logic signal which is input to the data formatter 15. Data formatter 15 converts the serial data into a word 26 which corresponds to the input word 8. The data word 26 is then converted into an analog signal 20 via the D to A converter 16.

The timing clock 5 is transmitted from chip 24 to chip 25 via LED 7 and is received by the light detector 12. The weak clock signal from detector 12 is then amplified to a logic level signal 17 and is then fed to the data formatter and the D to A converter for timing control. A scaling operational amplifier 18 is provided for conditioning the D to A output 20. The amplifier 21 has two differential inputs, In+23 and In—22, and an output 21. The terminals of the operational amplifier are accessed externally so that appropriate feedback elements can be added.

Note the positive power terminals, 3 and 19, of chips 24 and 25 respectively are isolated from each other. Not shown are the ground terminals of chips 24 and 25 which are also isolated from each other.

Thus, the circuit of FIG. 1A can accept a digital word and transmit a corresponding analog level to an output while being electrical isolated from each other. Note that the weak binary encoded light signal can be more easily detected than an analog signal since only two levels are required instead of a continuum of levels.

It should be noted that there can be variations of the circuit of FIG. 1. For example, only one LED-detector pair, 6 and 11, can be used if the serial data is transmitted asynchronously. Also, the data can be transmitted as a word of parallel bits if more LED-detector pairs are used. For example, if a word size is 8 bits then 8 LED-detector pairs can be used to transmit the word across the insulating barrier 10 and fed directly into the A to D converter 16. This parallel configuration results in greater bandwidth at the expense of more power and LED-detector pairs.

Figure 1B:
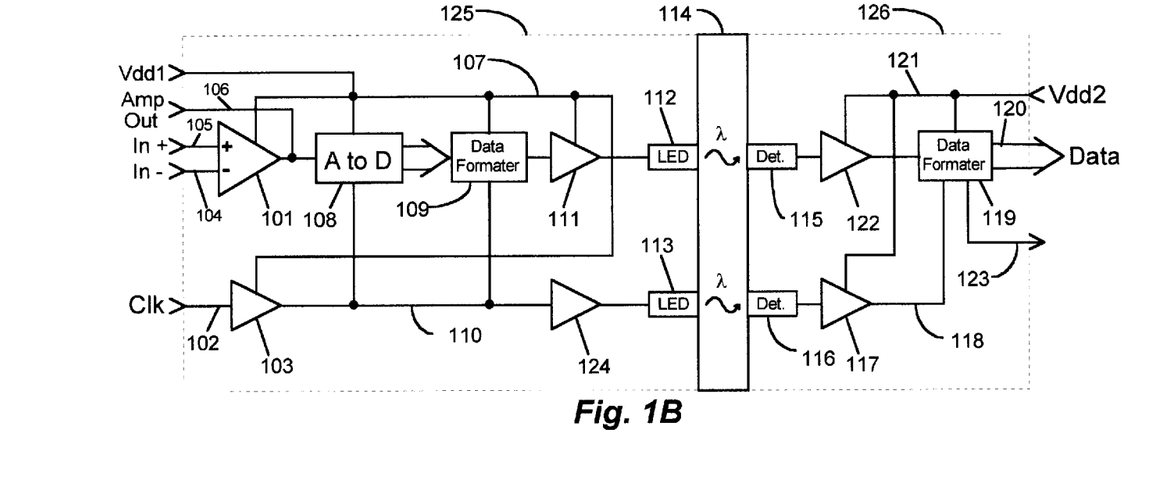
FIG. 1B shows a diagram of an optically isolated A to D converter.

FIG. 1B shows an example of an optically isolated analog to digital converter which is comprised of two silicon chips, 125 and 126. Chip 125 accepts an analog signal and then converts the signal to a digital number and subsequently transmits the number optically to the second chip 126 which outputs the digital number.

Chip 125 has an operational amplifier 101 which is used for scaling the analog signal input. It has differential inputs, In+105 and In−104, and an output 106. The output 106 of the operational amplifier 101 feeds into the A to D converter 108 which outputs a logic word to the Data Formatter 109. The Data Formatter 109 then converts the parallel word into serial data. The output of the Data Formatter 109 connects to buffer 111 which drives LED 112.

A clock signal 102 is also input to chip 125 and controls the timing for the A to D converter 108 and the Data Formatter 109. An input buffer 103 is used to take the external clock signal 102 and distribute the clock signal 110 to the converter 108 and the Data Formatter 109. Buffer 124 is used to drive LED 113 which transmits the clock signal to the second chip 126.

A transparent insulating barrier 114 is used to electrically isolate the chips 125 and 126 from one another. A light detector 115 on chip 126 is used to receive the data signal from chip 125. Amplifier 122 is used to amplify the weak signal from detector 115 and convert it into a logic level signal. The Data Formatter 119 then converts the serial data into a parallel word 120 which is output from chip 126. An output 123 from the Data Formatter 119 is used to signal when the output data 120 is stable.

Light detector 116 is used to receive the clock signal from chip 125. Amplifier 117 is used to ampify the weak signal from detector 116 and present a logic level signal to the internal clock bus 118 of chip 126.

Note the positive power terminals, 107 and 121, of chips 125 and 126 respectively are isolated from each other. Not shown are the ground terminals of chips 125 and 126 which are also isolated from each other.

It should be noted that there can be variations of the circuit of FIG. 1B. For example, only one LED-detector pair, 112 and 115, can be used if the serial data is transmitted asynchronously as can be appreciated by one normally skilled in the art. Also, the data can be transmitted as a word of parallel bits if more LED-detector pairs are used. Again, transmitting bits in parallel results in greater bandwidth at the expense of more power and LED-detector pairs.

Figure 2:
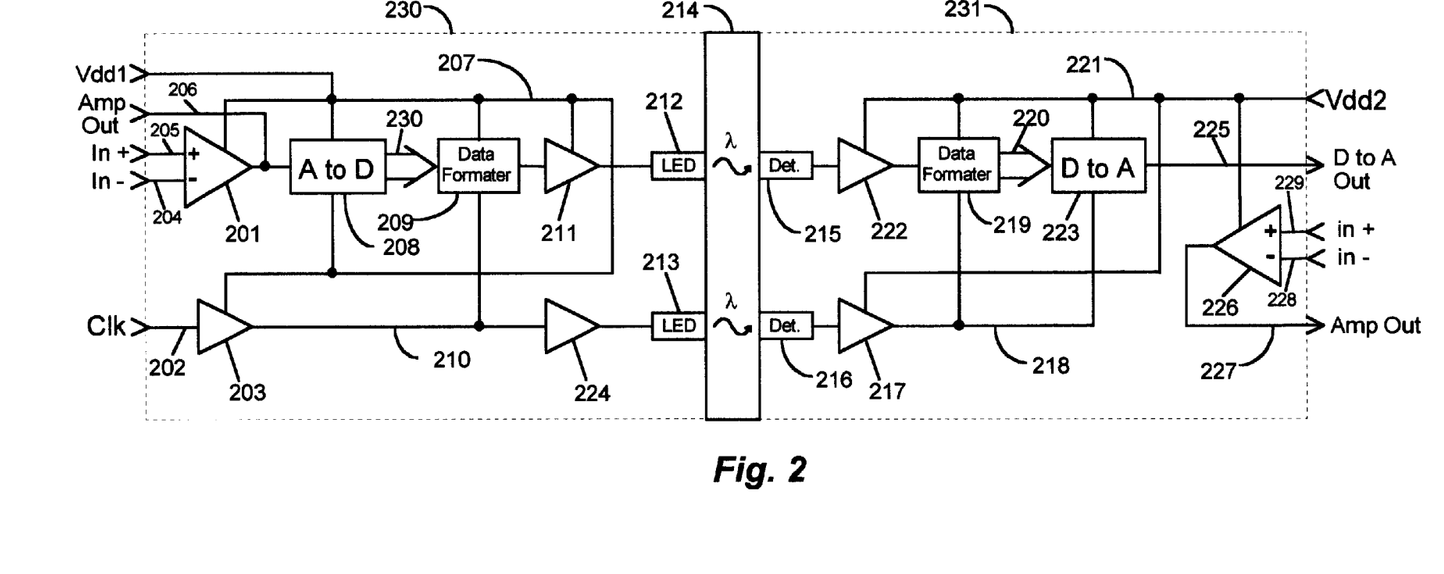
FIG. 2 shows a diagram of an optically isolated linear amplifier using D to A and A to D converters.

FIG. 2 show an example of an optically isolated circuit in which both the input and the output are analog signals. A to D and D to A circuits are used so that the light signal is transmitted digitally which will improve dynamic range and linearity.

Two chips, 230 and 231, are used. The input chip 230 has an operational amplifier 201 which is used for conditioning the input analog signal It has differential inputs, In+205 and In−204, and an output 206. The output 206 of the operational amplifier 201 feeds into the A to D converter 208 which in turn outputs a logic parallel word to the Data Formatter 209. The Data Formatter 209 then converts the parallel word into serial data The output of the Data Formatter 209 connects to buffer 211 which drives LED 212.

A clock signal 202 is also input to chip 225 and controls the timing for the A to D converter 208 and the Data Formatter 209. An input buffer 203 is used to distribute the clock signal 210 to the converter 208 and the Data Formatter 209. Buffer 224 is used to drive LED 213 which transmits the clock signal to the second chip 226.

A transparent insulating barrier 214 is used to electrically isolate the chips 230 and 231 from one another. A light detector 215 on chip 226 is used to receive the data signal from chip 230. Amplifier 222 is used to amplify the weak signal from detector 215 and convert it into a logic level signal. The Data Formatter 219 then converts the serial data into a word 220 which is output to a D to A converter 223. The analog output 225 of the D to A converter is then sent out from chip 231.

A scaling operational amplifier 226 is also provided with differential inputs 229 and 228 and an output 227.

Light detector 216 is used to receive the clock signal from chip 230. Amplifier 217 is used to amplify the weak signal from detector 216 and present a logic level signal to the internal clock bus 218 of chip 231.

As with the previous examples, the clock portion of the opto coupler can be eliminated if asynchronous transmission techniques are used. Also, as before, data can be optically transmitted as a group of parallel bits at the expense of power and additional LED-Detector pairs. Also, an internal oscillator of appropriate frequency can be placed onto chip 230 for generation of the timing clock 210.

Figure 3:
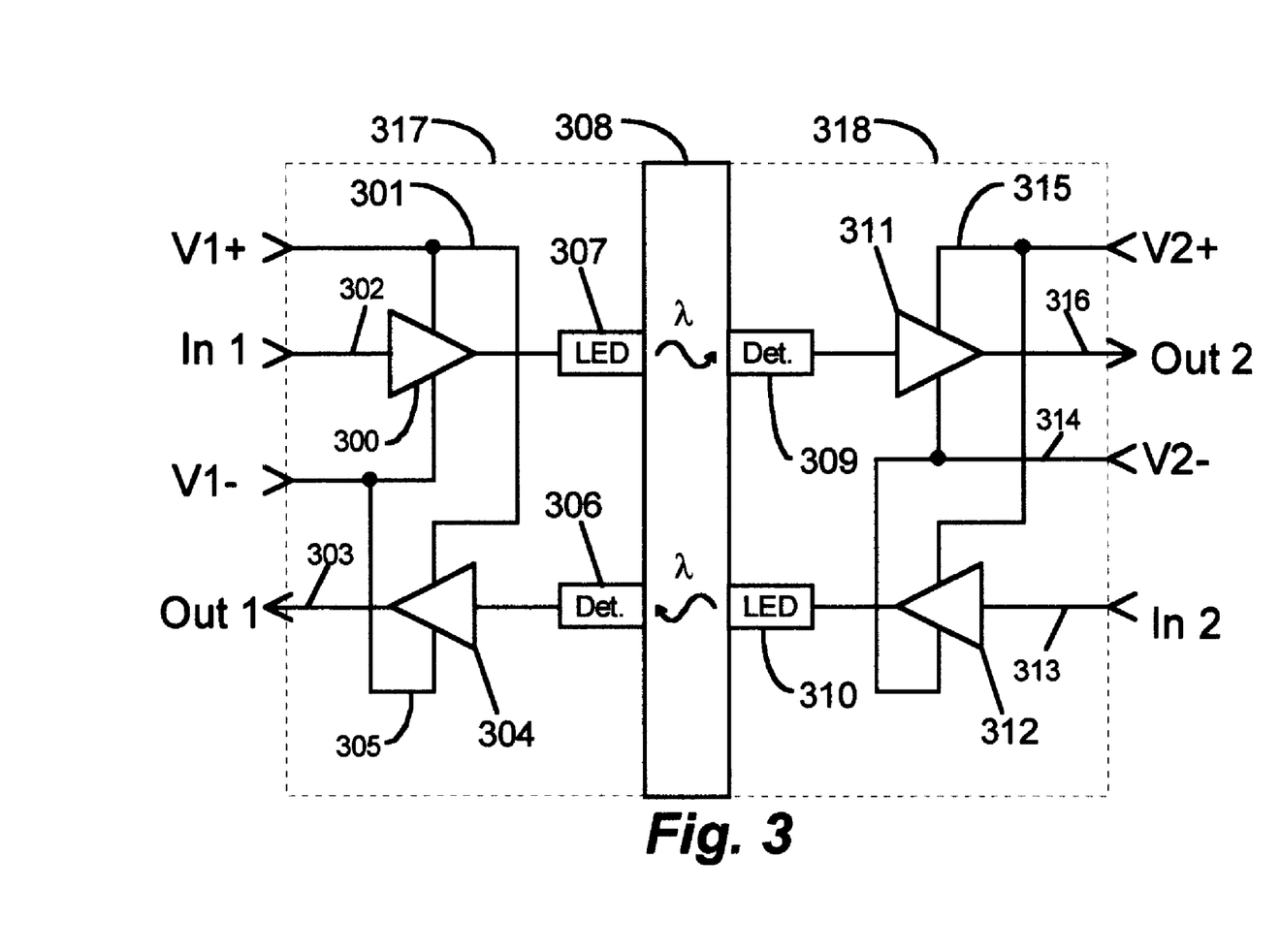
FIG. 3 shows a diagram of an optically isolated bidirectional logic buffer/line driver.

FIG. 3 shows an example of a optically coupled bidirectional digital data transceiver. This arrangement allows digital data to be sent and received while electrically isolating the signal paths. Applications include standard data buses such as the RS232.

The bus driver of FIG. 3 includes two chips, 317 and 318, and a transparent insulating barrier, 308. For chip 317 data is input to buffer 300 from lead 302. Buffer 302 then drives LED 307 which transmits a light signal across the transparent isolation barrier 308. This light is received by light detector 309 of chip 318 which produces a weak signal. The signal is amplified by 311 which outputs a logic level signal on lead 316.

In the other direction data is input on lead 313 which is the input for buffer 312. Buffer 312 drives LED 310 which sends a light signal across the barrier 308. Light detector 306 of chip 317 receives the signal and sends it to amplifier 304 which outputs a logic level signal on lead 303.

Positive power for chip 317 is input on lead 301 and negative power on lead 305. For chip 318 positive power is input on lead 315 and negative power on 314. Note that the power supply voltage levels for each chip can be at different magnitudes depending on the bus logic level requirements of each interface.

For one normally skilled in the art, the circuit of FIG. 3 can be also configured as an tri-state, optically isolated I/O interface driver.

Figure 4:
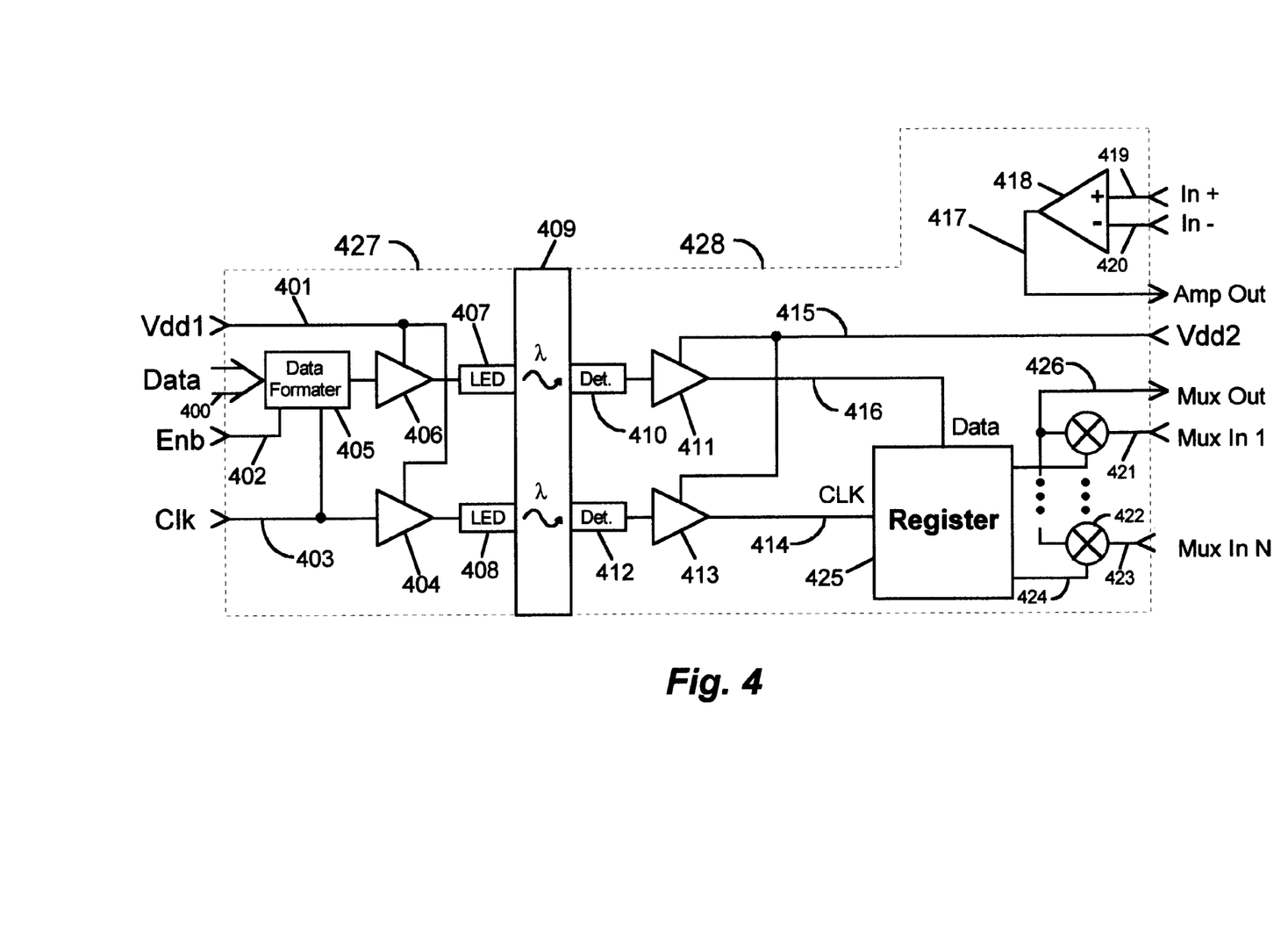
FIG. 4 shows a multiplexer whose control inputs are optically isolated.

FIG. 4 is an example of a two chip optically isolated multiplexer. In this case a digital word is used to control a multi-channel multiplexer.

The digital word 400 is input to the Data Formatter 405 of chip 427. The Data Formatter 405 converts the data word 400 into a serial format for transmission. The enable control 402 of the Data Formatter is used to signal that the data is stable and is ready for transmission. The serial output of Data Formatter 405 is fed into a buffer 406 which turn drives LED 407. The light signal from LED 407 crosses the transparent insulating barrier 409 and is received by light detector 410 of chip 428. The weak signal from 410 is amplified by 411 which outputs a logic level signal to the data input 416 of register 425. This data is used to turn on one switch of an N input multiplexer. The multiplexer is capable of steering one of the N input signals to an output 426. The first multiplexer input is terminal 421 and the Nth multiplexer input is terminal 423. The multiplexing device is a switch such as 422 with a control lead such as 424 which comes from the register 425. Register 425 stores the data associated with which switch position of the N switches is enabled or turned "on".

To control timing a clock signal 403 is used. The clock signal 403 sequences the data flow of the Data Formatter 405. Clock signal 403 is also fed to buffer 404 which in turn drives LED 408. LED 408 sends the clock signal across the barrier 409 to light detector 412. The weak signal from detector 412 is then amplified by amplifier 413 which outputs a logic level signal 414. The clock signal 414 is then used to sequence the register 425.

A signal conditioning amplifier 418 is also present which can be hooked up to the output 426 of the multiplexer if analog signals are being input to the multiplexer. The amplifier 418 consists of differential inputs, 419 and 420, and an output 417. Appropriate external feedback components can be added to the amplifier for the required signal conditioning.

Power for chip 427 is provided by lead 401 and for chip 428 by lead 415. Ground power is not shown but is also separate for each chip.

Other applications using the basic configuration shown in FIG. 4 are also possible as can be appreciated by one normally skilled in the art. For example, the output 426 can be grounded and the multiplex switches such as 422 can be power switches. Thus, the multiplex inputs can function as "On-Off" power switches to ground for the purpose of actuating electromechanical devices. The output 426 can also be hooked to a power node for the purpose of switching power to devices hooked to any of the inputs such as 421 or 423. In these applications note that more than one switch such as 422 can be turned "on" at any given time.

Figure 5:
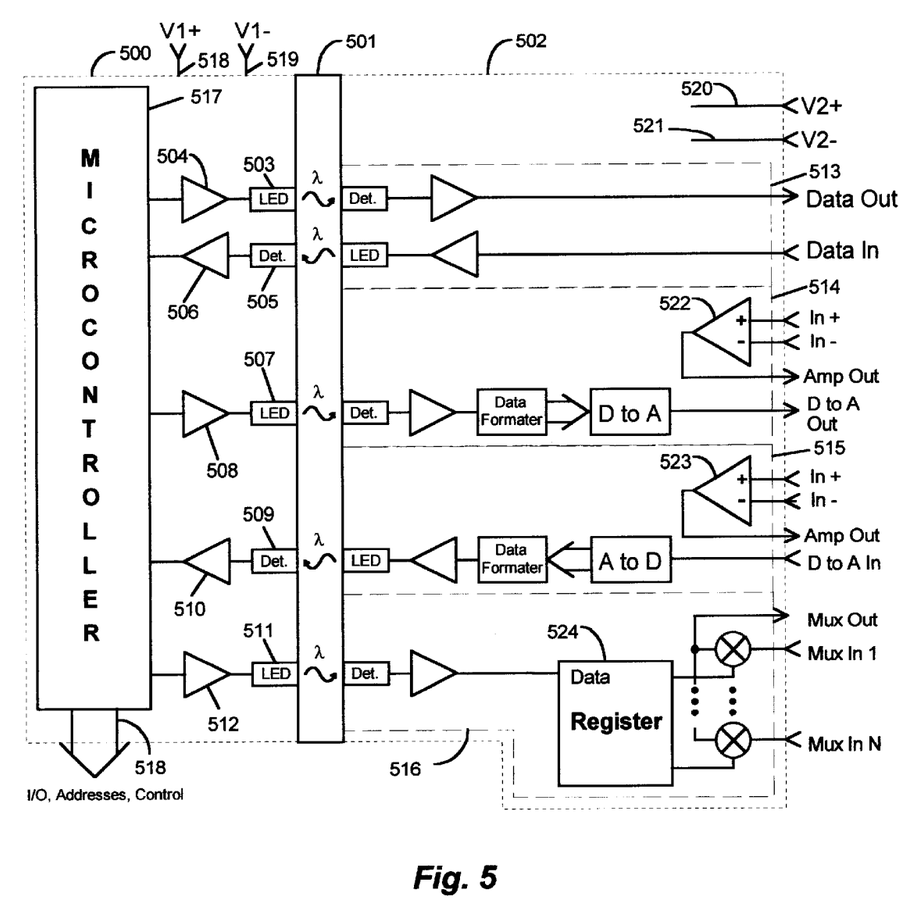
FIG. 5 shows a microcontroller with an optically isolated I/O, an optically isolated D to A converter, an optically isolated A to D converter, and an optically isolated multiplexer.

FIG. 5 shows an application in which a microcontroller chip, 500, controls optically isolated interface circuits such as logic I/O 513, a D to A converter 514, an A to D converter 515, and a multiplexer 516. All of the aforementioned optically isolated interface circuits reside on a single silicon chip, 502. The operation of these interface circuits is similar to that associated with FIGS. 1A, 1B, 3, and 4. Normal, non isolated I/O associated with the microcontroller such as memory addresses, data I/O ports, control lines, etc. are represented by 518.

The microcontroller chip 500 includes integrated optical communication devices such LEDs and light detectors. As mentioned before, the integrated LEDs can be porous silicon devices, avalanching silicon PN junction diodes, forward biased silicon PN junction diodes, deposited silicon carbide junction diodes, light emitting polymer, or deposited GaAs diode. The light detectors can be PN diodes, Schottky diodes, or photoconductors. Thus, the system depicted in FIG. 5 consists of two silicon chips, 500 and 502, and a transparent insulating barrier 501.

In FIG. 5, the microcontroller circuit 517 within chip 500 drives a buffer 504 which drives an on chip LED 503 which sends a light data signal across the transparent barrier 501 to the logic I/O module 513. The I/O module 513 receives the light signal and converts it into a stream of digital data. Conversely, the I/O module 513 can send data back to the microcontroller 517 via detector 505 and amplifier 506.

To transmit an optically isolated analog signal from the microcontroller 517 a digital word corresponding to the desired analog level is sent to module 514 of chip 502 via the buffer 508 and the LED 507. Also provided in module 514 is a scaling operational amplifier/buffer 522 which can scale the voltage output from the D to A converter of module 514.

Correspondingly, the microcontroller can receive an optically isolated analog signal via the A to D module 515. The A to D module 515 converts the analog signal level into a digital word. Detector 509 and amplifier 510 are used to receive the light signal from module 515 and input the A to D data into the microcontroller 517. The operational amplifier 523 is used to scale the analog signal for the A to D converter of module 515.

Module 516 is an analog multiplexer and can used to select one of several analog voltage sources for input to the A to D module 515. Buffer 512 and LED 511 are used to send multiplexer addressing data from the microcontroller 517 to the data register 524 which stores the multiplexer address data.

Not shown in the diagram is the clock signal which is optically fed from the microcontroller to the various circuits of chip 502. The clock is used to time or sequence data communication between the various modules of chip 502 and the microcontroller.

Power for the microcontroller chip 500 is provided via terminal 518 and 519 and power for chip 502 is provided via terminals 520 and 521. Note that additional power supply terminals may be required for chip 502 depending on what power levels are required to operated the various interface modules.

To reduce the number of LED-detector pairs, it is possible to use serial registers to receive and transmit data between the modules of chip 502 and the microcontroller. The serial registers will require both an address word for the target module and a data word for the target module. Reducing the LED-detector pairs in this manor reduces the bandwidth of data transmission between the microcontroller and the modules of chip 502.

FIG. 5 is only an example of the various type of interface modules that can be optically interfaced to a microcontroller 517. For example, addressable power switches can be added as appreciated by one normally skilled in the art.

It is noted that the two chip optically coupled devices illustrated here can be reduced to a single integrated chip using Silicon-On-Insulator (SOI) technology given that the devices on SOI are dialectically insulated. Light coupling from an "on chip" LED to a detector can be achieved by building wave guides on the surface of the SOI chip using a deposited and patterned transparent dielectric as the wave guide. A deposited coating can be applied over the dielectric wave guide with the optical diffraction constant of the coating being different from that of the wave guide so that the light is confined to the wave guide.

I claim:

1. An opto-coupler comprising:
   an LED integrated onto a first silicon chip;
   a light detector integrated onto a second silicon chip, electrically isolated from the first chip;
   a transparent insulating barrier separating the first and second chip;
   a first buffer integrated onto the first chip for receiving a digital serial input signal and driving the LED;
      wherein the LED is driven to transmit a light signal based on the digital serial input signal, across the transparent insulating barrier; and
      wherein the detector receives the light signal and outputs an electrical signal to a first amplifier integrated onto the second chip.

2. The opto-coupler of claim 1 wherein the integrated LED is fabricated using porous silicon.

3. The opto-coupler of claim 1 wherein the integrated LED is fabricated using deposited silicon carbide.

4. The opto-coupler of claim 1 wherein the integrated LED is fabricated using a light emitting polymer.

5. The opto-coupler of claim 1 wherein the integrated LED is an avalanching silicon PN junction.

6. The opto-coupler of claim 1 wherein the detector is PN diode.

7. The opto-coupler of claim 1 wherein the detector is a photoconductor.

8. The opto-coupler of claim 1 further comprising:
   a first data formatter, integrated onto the first chip, connected to an input of the first buffer for converting an input digital data word into the digital serial input signal; and
   a clock signal inputted into the data formatter for timing the operation of the first data formatter.

9. The opto-coupler of claim 8 wherein the clock signal is also inputted into a second buffer, integrated onto the first chip, for driving a second LED integrated onto the first chip, wherein the second LED is driven to transmit a second light signal, based on the clock signal, across the transparent insulating barrier.

10. The opto-coupler of claim 9 further comprising:
    a second detector, integrated onto the second chip, for receiving the second light signal; and
    a second amplifier, integrated onto the second chip, connected to the second detector for outputting an output clock signal.

11. The opto-coupler of claim 10 further comprising:
    a second data formatter connected to the first amplfier for converting the output of the first amplifier into an output digital data word; and
       wherein the output clock signal is inputted into the second data formatter for timing the operation of the second data formatter.

12. The opto-coupler of claim 11 further comprising a D to A converter, integrated onto the second chip, for converting the output digital data word into an output analog signal.

13. The opto-coupler of claim 11 further comprising an A to D converter, integrated onto the first chip, connected to an input of the first data formatter for converting a first analog input signal into the input digital data word.

14. The opto-coupler of claim 13 further comprising an operational amplifier, integrated onto the first chip, for scaling a second analog input signal into the first analog input signal.

15. The opto-coupler of claim 10 further comprising:
    a register, integrated onto the second chip, connected to the output of the first amplifier;
       wherein the output clock signal is inputted into the register for timing the operation of the register;
    an Nth input multiplexer connected to outputs of the register;
       wherein the Nth input multiplexer switches one of N multiplexer inputs to an output lead based on the outputs of the register.

16. An optically coupled transceiver for sending and receiving data across electrically isolated paths, comprising:
    a first and second silicon chip, electrically isolated from each other, and separated by a transparent insulating barrier;
    wherein each chip includes:
       an integrated LED for transmitting a light signal containing data across the barrier to the other chip;
       an integrated buffer for driving the LED;
       an integrated light detector for detecting the light signal from the other chip; and
       an integrated amplifier for amplifying the output of the detector.

17. The optically coupled transceiver of claim 16 wherein the integrated LED is fabricated using porous silicon.

18. The optically coupled transceiver of claim 16 wherein the integrated LED is fabricated using deposited silicon carbine.

19. The optically coupled transceiver of claim 16 wherein the integrated LED is fabricated using a light emitting polymer.

20. The optically coupled transceiver of claim 16 wherein the integrated LED is an avalanching silicon PN junction.

21. The optically coupled transceiver of claim 16 wherein the detector is PN diode.

22. The optically coupled transceiver of claim 16 wherein the detector is a photoconductor.

23. An optically coupled communication device comprising:
    a first and second silicon chip, electrically isolated from each other, and separated by a transparent insulating barrier;
    a plurality of LEDs and light detectors integrated onto the first chip;
    a microcontroller integrated on the first chip for sending data to the plurality of LEDs and receiving data from the plurality of light detectors;

wherein the microcontroller includes data I/O ports and control lines for communicating with electrically non-isolated circuits; and a first module integrated onto the second chip including an LED for transmitting data to one of the plurality of light detectors on the first chip and a light detector for receiving data transmitted by one of the plurality of LEDs on the first chip.

* * * * *